(12) United States Patent
Miyaji et al.

(10) Patent No.: US 6,326,845 B1
(45) Date of Patent: Dec. 4, 2001

(54) FEEDFORWARD AMPLIFIER

(75) Inventors: Masayuki Miyaji, Takarazuka; Kaoru Ishida, Shinjonawate; Hiroaki Kosugi, Hirakata; Shin'ichi Kugou, Yokosuka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/504,365

(22) Filed: Feb. 15, 2000

(30) Foreign Application Priority Data

Feb. 16, 1999 (JP) .................................... 11-036708
Feb. 24, 1999 (JP) .................................... 11-046220

(51) Int. Cl.[7] ...................................... H03F 1/00
(52) U.S. Cl. ........................................ 330/151; 330/149
(58) Field of Search ........................... 330/149, 151, 330/52

(56) References Cited

U.S. PATENT DOCUMENTS

| 4,394,624 | * | 7/1983 | Bauman | 330/151 |
| 5,304,945 | * | 4/1994 | Myer | 330/149 |
| 5,386,198 | * | 1/1995 | Ripstrand et al. | 330/52 |
| 5,917,375 | * | 6/1999 | Lisco et al. | 330/151 |

OTHER PUBLICATIONS

John L.B. Walker, "High–Power GaAs FET Amplifiers", Artech House, pp. 332–333 (1993).
Yoshihiro Konishi, "Method for Constituting High–Frequency Microwave Circuit", pp. 134–135 (Jun. 20, 1993).
John L.B. Walker, "High–Power GaAs FET Amplifiers", Artech House, pp. 332–333 (1993).

* cited by examiner

Primary Examiner—Robert Pascal
Assistant Examiner—Henry Choe
(74) Attorney, Agent, or Firm—Ratner & Prestia, PC (57) ABSTRACT

A feedforward amplifier includes a power divider for dividing the input signal into first and second signals. The first signal is processed in a first path that includes, in sequence, a first vector adjuster, a main amplifier, a directional coupler and a delay circuit. The second signal is delayed in a second path that includes, in sequence, another delay circuit, a first power combiner and an auxiliary amplifier block. The first power combiner combines the first signal, by way of a coupling port from the directional coupler, with the second signal to provide a combined signal into the auxiliary amplifier block. The auxiliary amplifier block further divides the second signal into two divided signals, each having a respective non-overlapping frequency band. The two divided signals are respectively vector adjusted, amplified, and then recombined. The recombined signal is then recombined with the processed signal in the first path to provide the desired output signal.

12 Claims, 8 Drawing Sheets

FEEDFORWARD AMPLIFIER

BACKGROUND OF THE INVENTION

1. Field of the Invention

The present invention relates to a feedforward amplifier which is mainly used in a device of a base station of a mobile communication system.

2. Related Art of the Invention

In order to collectively amplify a large number of signal channels, recently, a device of a base station of a mobile communication system is requested to be provided with a power amplifier which is excellent both in efficiency and linearity. The linearity is realized by performing distortion compensation according to the feedforward system.

A feedforward amplifier is described by, for example, John L. B. Walker, "High-Power GaAs FET Amplifiers," Artech House, 1993, p.p. 332 to 333.

Figure 7:
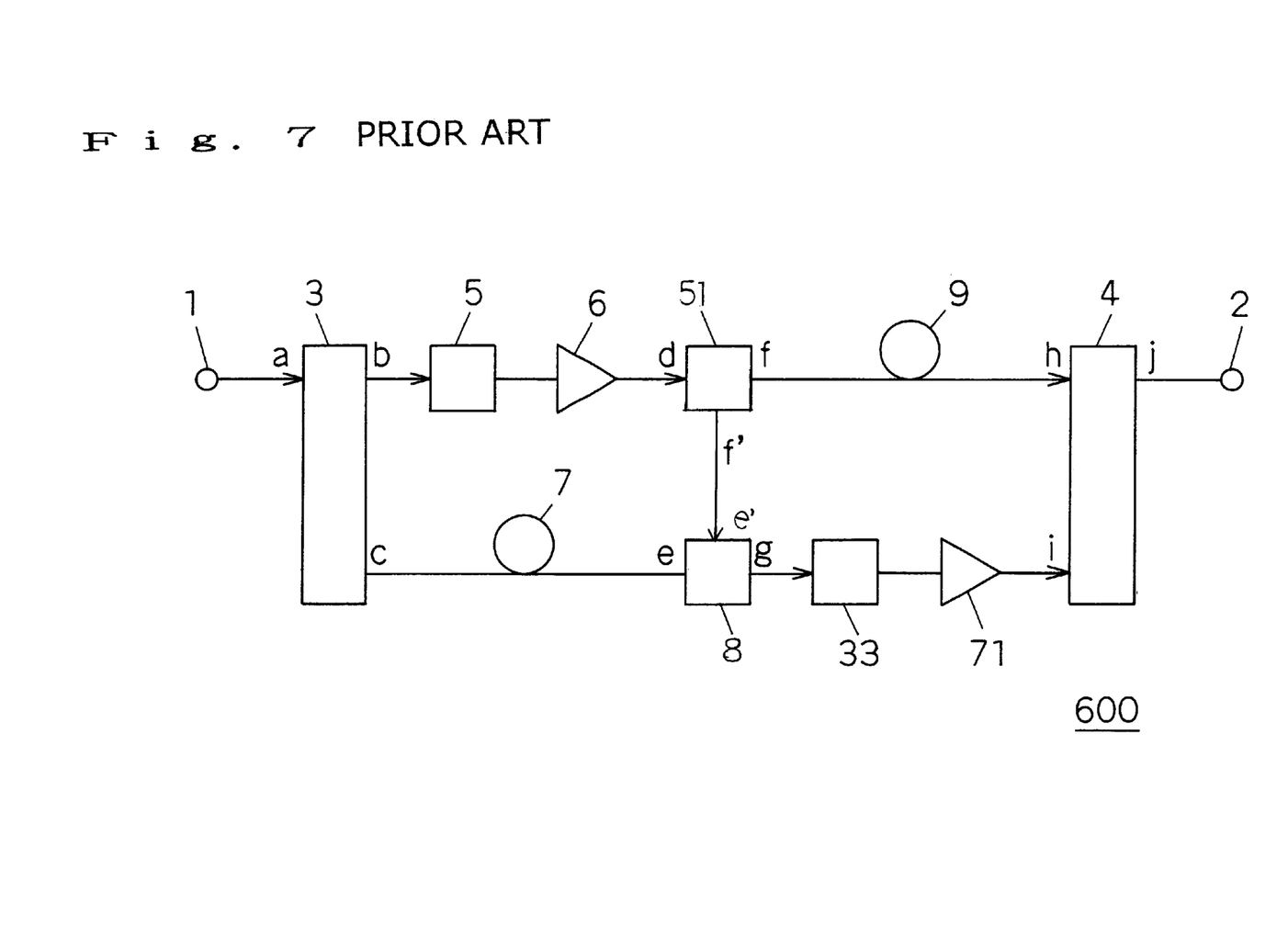
FIG. 7 is a diagram of a feedforward amplifier 600 of the conventional art.

FIG. 7 is a diagram showing an example of the configuration of a feedforward amplifier of the conventional art. As shown in the figure, in a feedforward amplifier 600, an input terminal 1 allows an external signal to be input to the feedforward amplifier 600. An output terminal 2 allows a signal to be output from the feedforward amplifier 600 to the external. A power divider 3 divides the input from the input terminal 1 into two signals, and supplies the signals to a vector adjuster 5, and a delay circuit 7 of a coaxial cable, respectively.

A main amplifier 6 amplifies an input from the vector adjuster 5. Directional coupler 51 receives the output of the main amplifier 6 outputs almost signals to delay circuit 9 from main port and outputs few signals to after-mentioned power combiner 8 from couple port. The power combiner 8 receives the output from the couple port of the directional coupler 51 and the output of the delay circuit 7 and outputs signals to a vector adjuster 33. An error amplifier 71 amplifies an input from the vector adjuster 33.

A power combiner 4 combines inputs from the delay circuit 9 and the error amplifier 33 with each other and supplies the resulting signal to the output terminal 2. The characters a to j, e' and f' attached to the power divider 3, the power combiner 4, directional coupler 51 and the power combiner 8 indicate signal input/output ports of the devices, respectively.

The operation of the thus configured feedforward amplifier of the conventional art will be described.

First, an input signal which is input via the input terminal 1 and contains multi-channel components is divided into two signals by the power divider 3. One of the two divided signals is amplified by the main amplifier 6 via the vector adjuster 5. At this time, because of the nonlinearity of the main amplifier 6, the signal which contains distortion components is generated.

The signal which is amplified by the main amplifer 6, is supplied to input port d of the directional coupler 51, and almost signal are output from the output port f and a few signal is output from the output port f' to be supplied to the input port e' of the power combiner 8.

The other of the two divided signals is input to the input port e of the power combiner 8, via the delay circuit 7.

When the vector adjuster 5 and the delay circuit 7 are adjusted so that the input signal components of the input signals at the input ports e and e' have the equal amplitude and opposite phases, a signal in which the input signal components are canceled each other and which contains only distortion components is output from the output port g.

The signal which is output from the output port f and contains the input signal components and the distortion components is input to the input port h of the power combiner 4 via the delay circuit 9.

Figure 8:
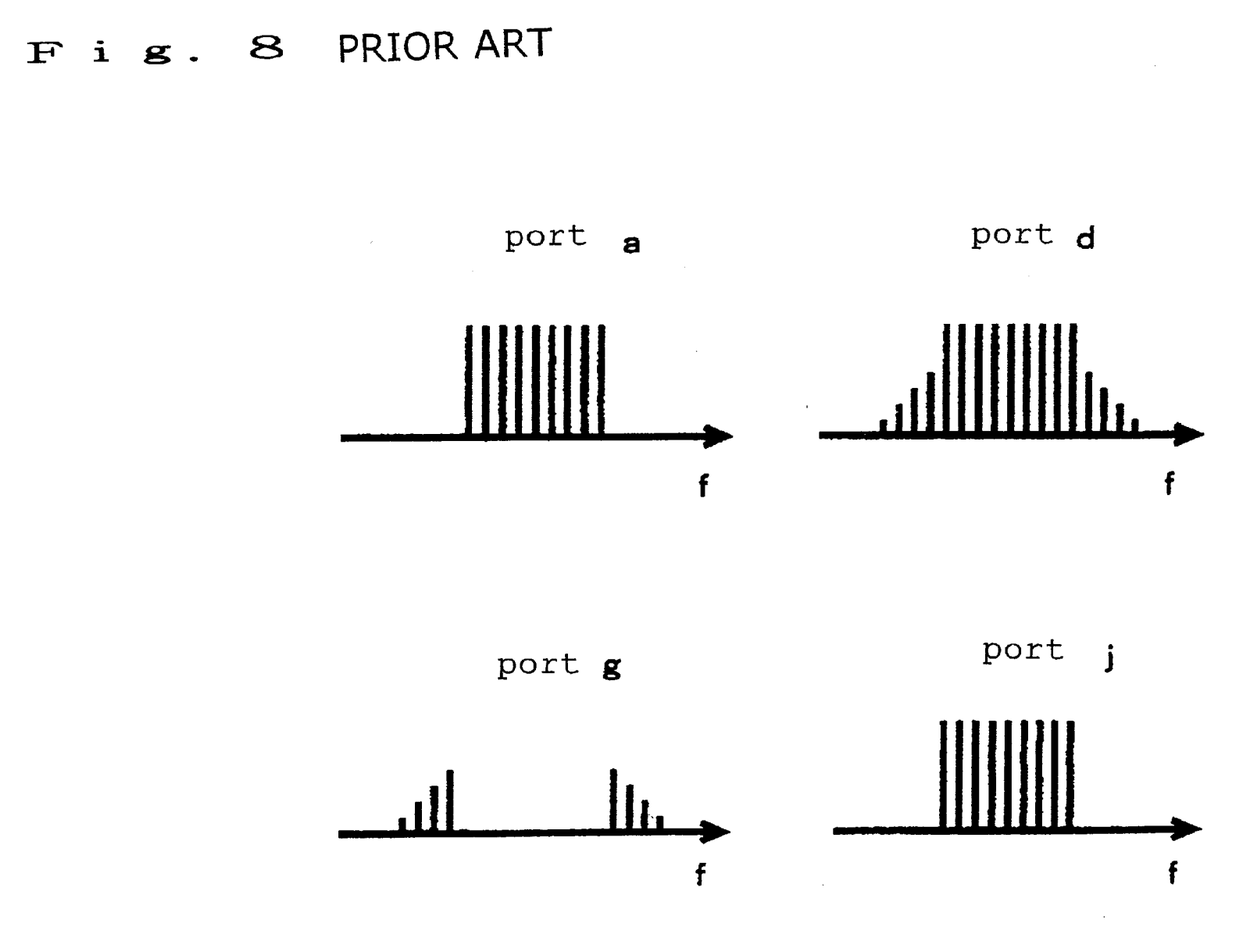
FIG. 8 is a frequency spectrum chart of signals at ports a, d, g, and j of the feedforward amplifier of the conventional art.

The distortion component signal output from the output port g is amplified by the error amplifier 71 via the vector adjuster 33, and the amplified signal is input to the input port i of the power combiner 4. When the vector adjuster 33 and the delay circuit 9 are adjusted so that the distortion components of the input signals at the input ports h and i have the equal amplitude and opposite phases, a signal in which the distortion components are canceled each other and which contains only the input signal components can be obtained from the output terminal 2. FIG. 8 shows frequency spectra of the signals at the ports a, d, g and j of FIG. 7.

The feedforward amplifier of the conventional art has the following problems.

A first problem is as follows. In the configuration of FIG. 7, in order to suppress the distortion component produced in the main amplifier 6 in a broader frequency band, the band of the error amplifier 71 must be broadened. Actually, it is difficult to configure the error amplifier 71 so as to have flat characteristics both in amplitude and phase over a broad frequency band. Although distortion components produced in a region very close to the channel band can be sufficiently suppressed, therefore, there arises a problem in that those produced in a region of the band edge are more hardly suppressed.

The configuration of the conventional art has a second problem in that the power consumption of the main amplifier 6 is large. In order to reduce distortion, a class A amplifier is usually used as the main amplifier 6. This means that the main amplifier produces lower distortion, but is lower in power efficiency and consumes a large power.

When a class AB amplifier is used so as to enhance the efficiency, distortion is increased and higher order intermodulation is caused, so that distortion is produced over a very wide frequency band. As a result, there arises a problem in that the above-mentioned feedforward system is not sufficient for canceling distortion components.

Specifically, distortion in a frequency band very close to the signal is canceled by the feedforward system, but that in frequency bands outside the band cannot be canceled because deviations in amplitude and phase are produced among paths.

A third problem is as follows. Each of delay elements used in the delay circuits 7 and 9 is configured by, for example, winding a coaxial cable in a spiral form. The cable is required to have a length of about 3 m. Therefore, there is a problem in that the delay elements occupy a large space and, in the case of a large power output, a large loss is caused by the power passing therethrough.

SUMMARY OF THE INVENTION

In order to solve the first problem, according to the first and second aspects of the invention, the feedforward amplifier is configured in the following manner.

A feedforward amplifier of the first present invention (corresponding to claim 1) comprises:
- a first power divider which divides an input signal into two signals;
- a first vector adjuster which adjusts an amplitude and a phase of one of output signals which are divided by said first power divider;
- a main amplifier which amplifies an output signal of said first vector adjuster;

a first delay circuit which delays another output signals which are divided by said first power divider;

a directional coupler which receives an output signal of said main amplifier and an output signal of said first delay circuit, and has a main port for outputting almost signals from the main amplifier and a couple port for outputting a few signals from the main amplifier;

a power combiner which receives an output signal of said couple port and an output signal of said first delay circuit,to output a combined signals thereof;

a second delay circuit which delays an output signal from said main port of said directional coupler;

an auxiliary amplifier block which amplifies an output signal from said power combiner; and a power combiner which outputs a combined signal of an output signal of said second delay circuit, and an output signal of said auxiliary amplifier block, said auxiliary amplifier block being a broadband auxiliary amplifier block having at least two error amplifiers which amplify the output signal from said power combiner while splitting the output signal into respective frequency bands that do not overlap with each other.

A feedforward amplifier of the second present invention (corresponding to claim 2) according to the first present invention is such amplifier that said broadband auxiliary amplifier block comprises:

a power divider which divides the output signal from said power combiner, into two signals;

a low-pass filter which allows a lower frequency component of one of output signals of said power divider;

a first vector adjuster which adjusts an amplitude and a phase of an output signal of said low-pass filter;

a first error amplifier which amplifies an output signal of said first vector adjuster;

a high-pass filter which allows a higher frequency component of another one of the output signals of said power divider;

a second vector adjuster which adjusts an amplitude and a phase of an output signal of said high-pass filter;

a second error amplifier which amplifies an output signal of said second vector adjuster; and a power combiner which outputs a combined signal of an output signal of said first error amplifier and an output signal of said second error amplifier, to said power combiner.

In order to solve the second and third problems, according to the third to seventh aspects of the invention, the feedforward amplifier is configured in the following manner.

A feedforward amplifier of the third present invention (corresponding to claim 3) comprises:

a power divider which divides an input signal into two signals;

a first vector adjuster which adjusts an amplitude and a phase of one of two output signals of said power divider;

a main amplifier for amplifying an output of said first vector adjuster;

a first delay circuit which delays another output signal of said power divider;

a directional coupler which receives an output signal of said main amplifier and an output signal of said first delay circuit, and has a main port for outputting almost signals from the main amplifier and a couple port for outputting a few signals from the main amplifier;

a power combiner which receives an output signal of said couple port and an output signal of said first delay circuit,to output a combined signals thereof;

a second delay circuit which delays the output of said main port of the directional coupler;

a second vector adjuster which adjusts an amplitude and a phase of an output signal of said power combiner;

an error amplifier which amplifies an output signal of said second vector adjuster; and a power combiner which combines an output signal of said second delay circuit with an output of said error amplifier, to output a combined signal;

said first vector adjuster and said first delay circuit being adjusted so that, in said power combiner objective signal components are canceled and only distortion components are contained, said second vector adjuster and said second delay circuit being adjusted so that, in a combined signal output from said power combiner, distortion components are canceled and only objective signal components are contained, at least said second delay circuit being configured by a filter having phase delaying characteristics.

According to this configuration, an effect that the volume of a delay circuit element can be remarkably reduced is attained. Particularly, the signal of a large power which has been power amplified by the main amplifier passes through the second delay filter but the configuration can attain another effect that the loss due to the passing signal can be reduced.

A feedforward amplifier of the fourth present invention (correspondig to claim 4) according to the present third invention is such amplifier that said main amplifier is a class AB power amplifier.

This configuration can attain an effect that the power efficiency can be improved, in addition to the above-mentioned effects.

A feedforward amplifier of the fifth present invention (corresponding to claim 5) according to the third or fourth present invention is such amplifier that a band-pass filter which allows only a signal of an objective frequency to pass through said filter is disposed at an output end of said power combiner.

This configuration can attain an effect that distortion which cannot be sufficiently canceled by a feedforward circuit can be canceled, in addition to the above-mentioned effects.

A feedforward amplifier of the sixth present invention (corresponding to claim 6) according to the present third or fourth invention) is such amplifier that said second delay circuit functions also as a band-pass filter, a band-pass filter is disposed between said power combiner and said second vector adjuster, and distortion components which cannot be canceled by a feedforward function are canceled by a function of said band-pass filters.

This configuration can attain an effect that distortion which cannot be sufficiently canceled by a feedforward circuit can be canceled, in addition to the above-mentioned effects.

A feedforward amplifier of the present seventh invention (corresponding to claim 7) comprises:

a divider which divides an input signal into outputs of plural systems;

plural feedforward amplifiers according to any one of the present third to sixth inventions, said amplifiers receiving the plural divided outputs of said divider, respectively, and amplifying the output;

a combiner which combines outputs of said plural feedforward amplifiers with one another; and a band-pass filter which is connected to an output end of said combiner, and which allows only a signal of an objective frequency to pass said filter.

According to this configuration, a high output power which cannot be realized by a single feedforward amplifier can be obtained, and since redundancy is provided, even when any single feedforward unit becomes faulty during operation, the feedforward amplifier can continue to operate only with somewhat reducing the output power, and operate so as to enhance the reliability of the system. As a result, it is possible to realize a feedforward amplifier which is small in size as a whole and consumes a small power.

BRIEF DESCRIPTION OF THE DRAWINGS

FIGS. 2(a)–2(f) is a frequency spectrum chart of signals at input/output ports a, d, g, m, n, and j of the feedforward amplifier 100 of the embodiment of FIG. 1;

DESCRIPTION OF THE REFERENCE NUMERALS AND SIGNS 1 input terminal
2 output terminal
3, 10 power divider
4, power combiner
5, 14, 15 vector adjuster
6, main amplifier
7, 9, delay circuit
8, power combiner
11 power combiner
12 low-pass filter
13 high-pass filter
16, 17, 71 error amplifier
18 broadband auxiliary amplifier block
100, 600 feedforward amplifier
31, 21 input terminal
32 power divider
33, 39 vector adjuster
34 main amplifier
38 power combiner
36, 37 delay filter
38 power combiner
410 error amplifier
411, 300 band-pass filter
412, 310 output terminal
420, 20a, 20b feedforward unit 22 Wilkinson power divider
23, 24, 28, 29 quarter-wavelength line
25, 27 absorbing resistor
26 Wilkinson power combiner
51 directional coupler
52 band-pass filter

PREFERRED EMBODIMENTS OF THE INVENTION

Hereinafter, the invention will be described with reference to the accompanying drawings showing its embodiments.

Figure 1:
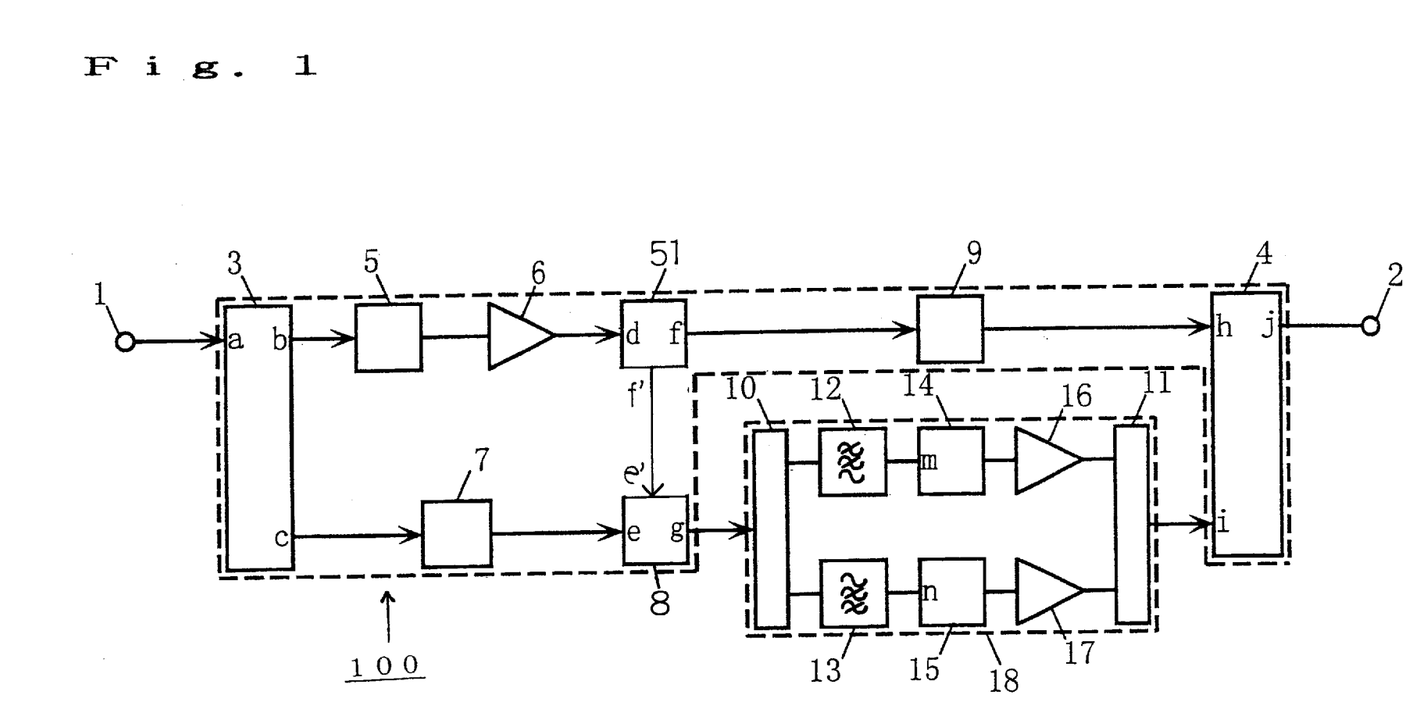
FIG. 1 is a diagram of a feedforward amplifier 100 which is an embodiment according to the first and second aspects of the invention.
Figure 2A:
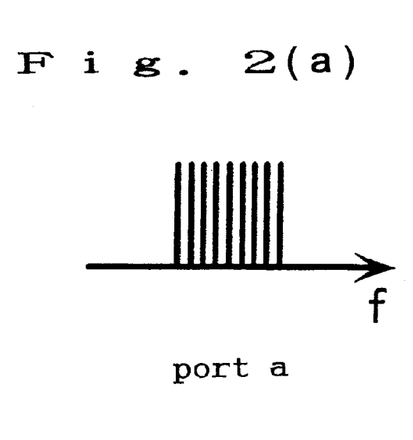
Figure 2B:
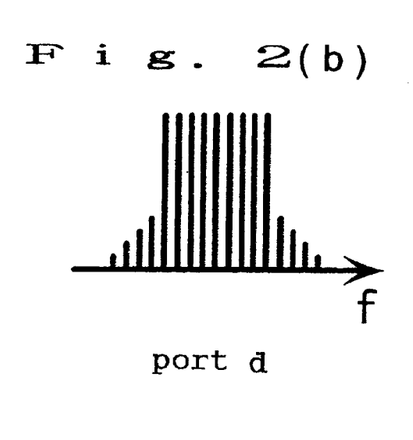
Figure 2C:
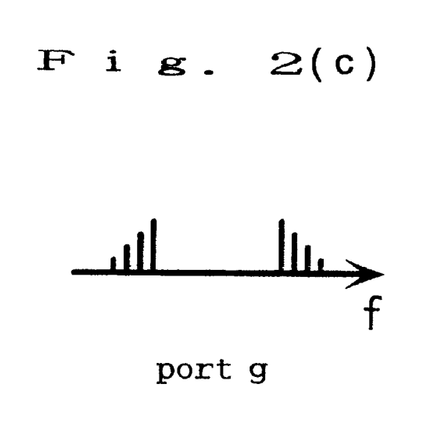
Figure 2D:
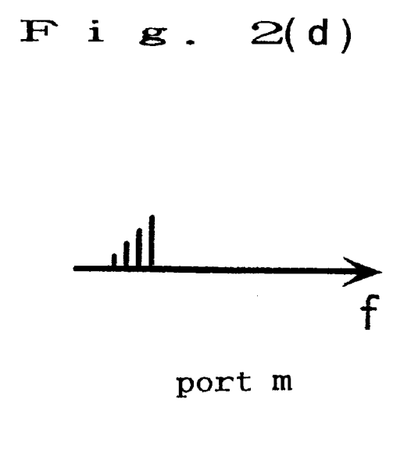
Figure 2E:
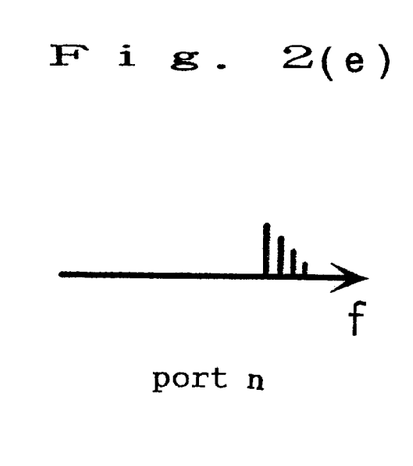
Figure 2F:
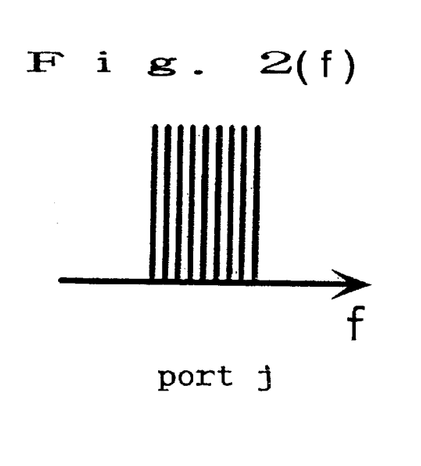

FIG. 1 is a diagram of a feedforward amplifier which is an embodiment according to the first and second aspects of the invention. As shown in the figure, in a feedforward amplifier 100, an input terminal 1 allows an external signal to be input to the feedforward amplifier 100. An output terminal 2 allows a signal to be output from the feedforward amplifier 100 to the external. A power divider 3 divides the input from the input terminal 1 into two signals, and supplies the signals to a vector adjuster 5 and a delay circuit 7, respectively. A main amplifier 6 amplifies an input from the vector adjuster 5. A directional coupler 51 is such means for receiving signal from the main amplifier 6 and ouputting almost signals to delay circuit 7 from the main port and outputting a few signals to the after-mentioned power combiner 8. A power combiner 8 receives inputs from the couple port of the directional coupler 51 and from the delay circuit 7 and outputs signals to a broadband auxiliary amplifier block 18. A power combiner 4 combines inputs from the delay circuit 9 and the broadband auxiliary amplifier block 18 with each other and supplies the resulting signal to the output terminal 2.

The characters a to j, e, f' attached to the power divider 3, the power combiner 4, directional coupler 51 and the power combiner 8 indicate signal input/output ports of the devices, respectively.

In the broadband auxiliary amplifier block 18, a power divider 10 divides an input from the output port g of the power combiner 8 into two signals, and supplies the signals to a low-pass filter 12, and a high-pass filter 13, respectively. The low-pass filter 12 allows only components of the input signal which have a lower frequency, to pass therethrough, and the high-pass filter 13 allows only those of the input signal which have a higher frequency, to pass therethrough. Vector adjusters 14 and 15 operate in the same manner as those of the prior art, error amplifiers 16 and 17 amplify distortion components. A power combiner 11 combines inputs from the error amplifiers 16 and 17 with each other and supplies the resulting signal to the input port i of the power combiner 4. The characters m and n attached to the vector adjusters 14 and 15 indicate signal input ports, respectively.

The operation of the thus configured feedforward amplifier will be described with reference to the accompanying drawings.

First, an input signal which is input via the input terminal 1 and contains multi-channel components is divided into two signals by the power divider 3. One of the two divided signals is amplified by the main amplifier 6 via the vector adjuster 5. At this time, because of the nonlinearity of the main amplifier 6, the distortion components due to intermodulation is generated. The other signal which is amplified by the main amplifer 6, is supplied to input port d of the directional coupler 51, and almost signal are output from the output port f and a few signal is output from the output port f' to be supplied to the input port e' of the power combiner 8. The other of the two divided signals is input to the input port e of the power combiner 8, via the delay circuit 7. When the vector adjuster 5 and the delay circuit 7 are adjusted so that the input signal components of the input signals at the input ports e and e' have the equal amplitude and opposite phases, a signal in which the input signal components are canceled each other and which contains only distortion components is output from the output port g.

The signal which is output from the output port f and contains the input signal components and the distortion components is input to the input port h of the power combiner 4 via the delay circuit 9. The distortion component signal output from the output port g is divided into two signals by the power divider 10.

With respect to one of the two-divided signals, only distortion components which are lower in frequency than the channel band are allowed to pass through the low-pass filter 12, and then amplified by the error amplifier 16 via the vector adjuster 14. With respect to the other of the two-divided signals, only distortion components which are higher in frequency than the channel band are allowed to pass through the high-pass filter 13, and then amplified by the error amplifier 17 via the vector adjuster 15. Output signals of the error amplifiers 16 and 17 are combined with each other by the power combiner 11, and then input to the input port i of the power combiner 4. When the vector adjusters 14 and 15, and the delay circuit 9 are adjusted so that the distortion components of the input signals at the input ports h and i have the identical amplitude and opposite phases, a signal in which the distortion components are canceled each other and which contains only the input signal components is supplied from the output port j of the power combiner 4 to the output terminal 2.

In FIGS. 2, (a) to (f) are views respectively showing frequency spectra of the signals at the input/output ports a, d, g, m, n, and j shown in FIG. 1.

As described above, according to the feedforward amplifier of the embodiment, the error amplifier 16 amplifies the distortion components of the lower frequency band with respect to the channel band, and the error amplifier 17 amplifies those of the higher frequency band with respect to the channel band. As compared with the feedforward amplifier of the conventional art in which the distortion components of the whole band are amplified by the single error amplifier, therefore, the operation frequency band of the feedforward amplifier can be made excellent over a broad band.

In the embodiment described above, the broadband auxiliary amplifier block is configured so that distortion components of an input signal are divided into two frequency bands, and the divided distortion components are respectively amplified by the two error amplifiers. Alternatively, three or more band-pass filters may be disposed so that distortion components are divided into three or more frequency bands, and the divided distortion components are respectively amplified by three or more amplifiers. In the alternative, the operation frequency band of the feedforward amplifier can be made broader.

As seen from the above description, according to the invention, an error amplifier is configured to operate in parallel by a first error amplifier which amplifies distortion components of the lower frequency side with respect to the channel band, and a second error amplifier which amplifies distortion components of the higher frequency side with respect to the channel band, whereby the frequency band of the feedforward amplifier can be broadened.

The above-described invention relates to the first and second aspects of the invention which have been mentioned in the Summary section. Next, the third to seventh aspects of the invention which have been mentioned in the SUMMARY section will be described.

Figure 3:
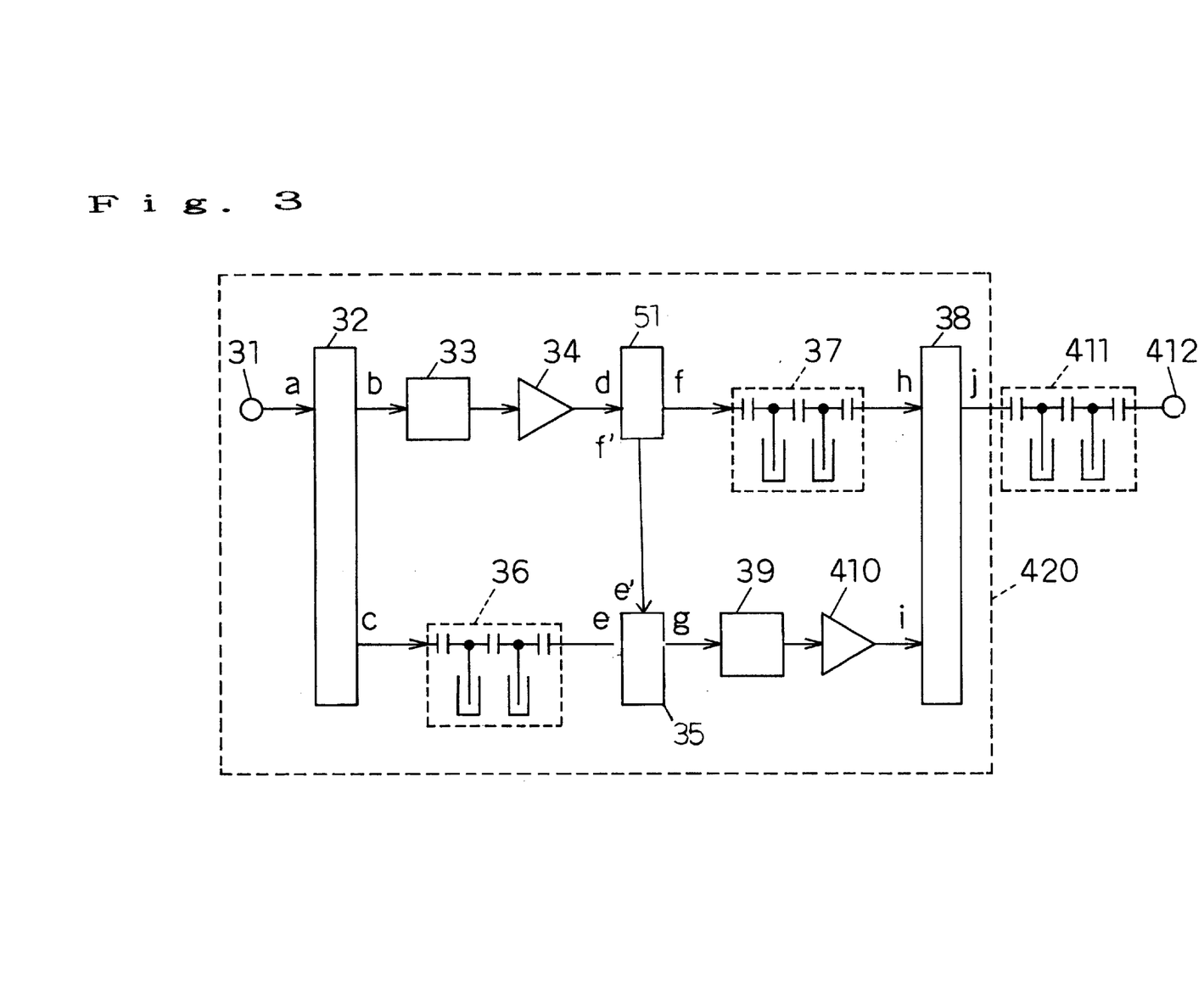
FIG. 3 is a block diagram of a feedforward amplifier which is an embodiment of another aspect of the invention.

Referring to FIG. 3 which is a block diagram of a feedforward amplifier of the embodiment, an input terminal 31 is connected to a port a of a power divider 32. A port b of the power divider 32 is connected to a main amplifier 34 which amplifies an input signal, via a vector adjuster 33 which adjusts the phase and the amplitude of a signal. The main amplifier 34 is connected to a port d of a directional coupler 51. The directional coupler 51 outputs almost inputted signals to port f and outputs a few inputted signals to port f'.

On the other hand, a port c of the power divider 32 is connected to a port e of the power combiner 35 via a delay filter 36. For example, the delay filter 36 is configured by two parallel-resonant circuits which are capacitively coupled to each other as illustrated, and delays a signal passing therethrough. The parallel-resonant circuits can be realized by a strip line.

The port f' is connected to a port e' of the power combiner 8.

The power combiner 35 receives signals from the port e, and e' and outputs the combined signals outsides from port g.

The port f of the directional coupler 51 is connected to a port h of a power combiner 38 via a second delay filter 37 which is configured in the same manner as the delay filter 36.

The port g of the power combiner 35 is connected to a port i of the power combiner 38, via a series circuit of a vector adjuster 39 which adjusts the phase and the amplitude of a signal, and an error amplifier 410.

A port j of the power combiner 38 is connected to an output terminal 412 via a band-pass filter 411 which allows a frequency band of an objective signal to pass therethrough.

Each of the delay filters 36 and 37 is a kind of band-pass filter, and designed with placing emphasis on the delaying characteristics rather than on the band passing characteristics. The band-pass filter 411 is designed with placing emphasis on the band passing characteristics rather than on the delaying characteristics.

A feedforward unit 420 which is enclosed by a broken line is used as a unit in the case where plural feedforward amplifiers are operated in parallel as described in the following embodiment.

The operation of the thus configured feedforward amplifier will be described.

First, an input signal which is input via the input terminal 31 and contains multi-channel components is input to the port a of the power divider 32 to be divided into two signals thereby. One of the two output signals is supplied from the port b to be adjusted in phase and amplitude by the vector adjuster 33, and then input to the main amplifier 34. The signal is power amplified by the amplifier 34, and the amplified signal is input to the port d of the directional coupler 51.

At this time, a signal which contains distortion components due to intermodulation in addition to the component of the input signal is produced because of the nonlinearity of the main amplifier 34.

The almost signals supplied to the port d of the directinal coupler 51 is output from port f and a few signals are output from port f' to be received by the port e' of the power combiner 35.

The other of the two divided signals is output from the port c to be delayed by the delay filter 36, and the delayed signal is input to the port e of the power combiner 35. The delay by the delay filter 36 is set so as to be substantially equal in degree to that by the main amplifier 34.

The vector adjuster 33 and the delay filter 36 are previously adjusted so that the input signal components of the input signals to the ports e and e' have the equal amplitude and opposite phases. Thus a signal in which the input signal components are canceled each other and which contains only the distortion components is output from the port g.

In order to attain opposite phases, the delay by the vector adjuster 33 is set to be large, so that the phase of the input signal via the port e' becomes opposite to that of the input signal via the port e. Alternatively, the vector adjuster 33 finely adjusts the phases to make the input signal via the port e' in phase with the input signal via the port e, and, in the directional coupler 51 and the power combiner 35, an addition is then performed while making the phase of the input signal via the port e' opposite to that of the input signal via the port e.

The signal which is output from the output port f and contains the input signal components and the distortion components is delayed by the delay filter 37, and the delayed signal is input to the port h of the power combiner 38. The distortion component signal output from the port g is adjusted in phase and amplitude by the vector adjuster 39, and then amplified by the error amplifier 410. The amplified signal is input to the port i of the power combiner 38.

The vector adjuster 39, the error amplifier 410, and the delay filter 37 are adjusted so that the distortion components of the input signals to the input ports h and i have the equal amplitude and opposite phases. As a result, a signal in which the distortion components are canceled each other and which contains only the input signal components should be output from the port j. Also in this case, the delay by the delay filter 37 is set so as to be substantially equal in degree to that by the error amplifier 410, and the delay by the vector adjuster 39 is set to be large, so that distortion components of the input signal to the port h, and the distortion signal to the port i are input with being opposite in phase to each other. Alternatively, the vector adjuster 39 performs only fine adjustment of the phase, and, in the power combiner 38, an addition is then performed while making the input distortion components via the port h opposite in phase to those via the port i. As a result, a signal in which the distortion components are canceled is output from the port j.

However, the main amplifier 34 is configured b y a class AB amplifier in order to enhance the efficiency, and hence intermodulation distortion is larger as compared with the case of a class A amplifier. Therefore, the signal output from the port j remains to contain distortion components of the outer side band that has been discussed in the Related Art section. To comply with this, the band-pass filter 411 is inserted between the port j of the power combiner 38 and the output terminal 412, whereby only the objective signal is allowed to pass through the filter, so that all of distortion components due to intermodulation are canceled and distortion is lowered to a level at which there arises no problem.

As described above, in the embodiment, the use of a delay filter in place of a delay circuit remarkably reduces the volume of the element, and that of a class AB amplifier as the main amplifier improves the power efficiency of the amplifier to reduce the power consumption. The increased portion of intermodulation distortion is suppressed by the band-pass filter. As a result, it is possible to realize a feedforward amplifier which is small in size and consumes a small power.

Especially as to the delay filter 37, the signal which has been power amplified by the main amplifier 34 passes through the delay filter 37 and the delay filter 37 can attain not only an effect that the volume is reduced by the use of the delay filter 37 as compared with the conventional case where a coaxial delay circuit is used, but also an effect that the loss with respect to the passing signal can be reduced. When one of the delay filters 36 and 37 is to be replaced with a delay circuit of the prior art, therefore, the delay filter 37 should have preference to the delay filter 36.

Figure 4:
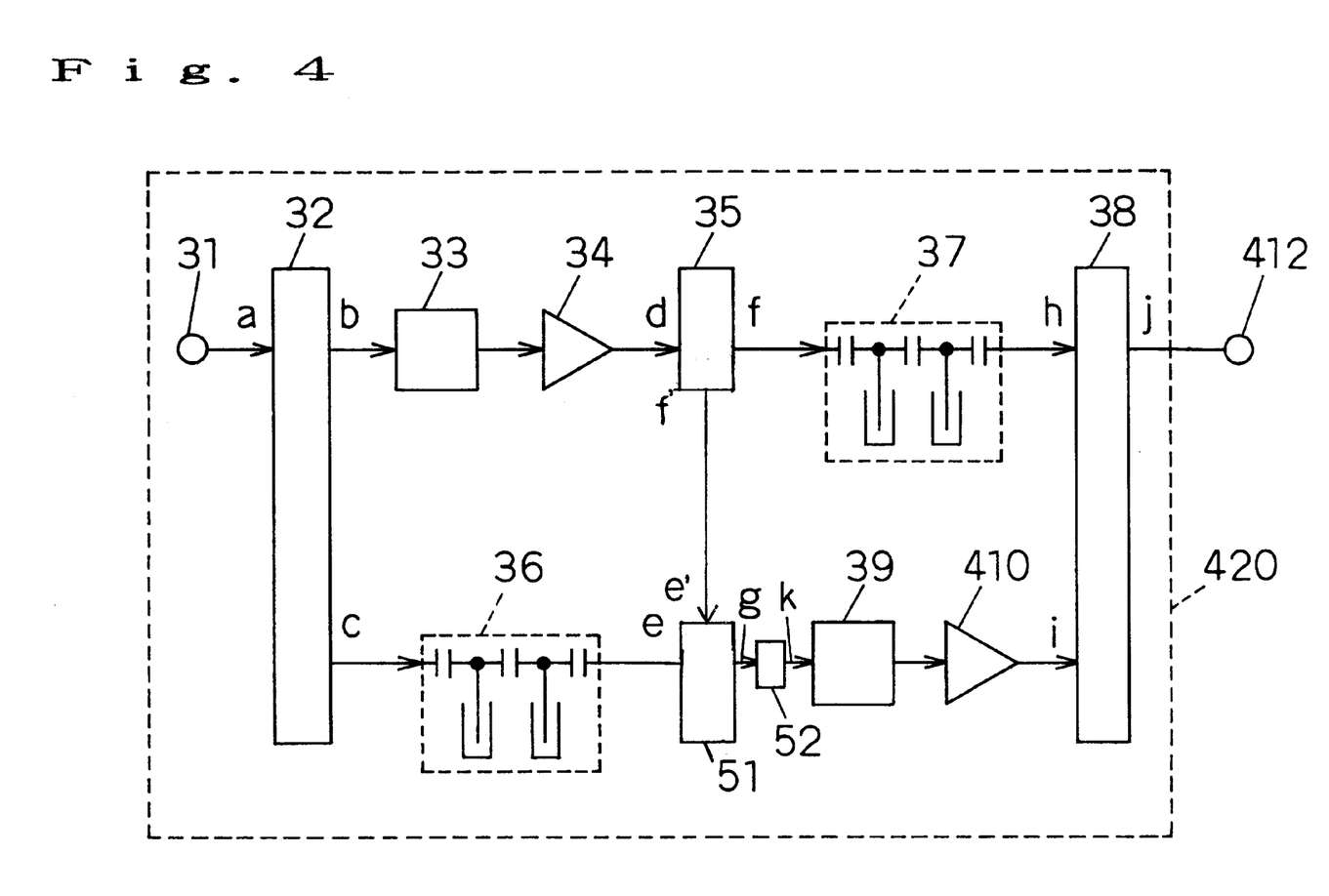
FIG. 4 is a block diagram of a feedforward amplifier which is an embodiment of another aspect of the invention.

Next, a further embodiment of the invention will be described. FIG. 4 is a diagram showing the circuit configuration of the embodiment The embodiment is different from that of FIG. 3 in that the band-pass filter 411 is not disposed and the delay filter 37 has a band-pass filter function in addition to the delay function, and also that a band-pass filter 52 is connected between the port g and the vector adjuster 39.

Figure 5:
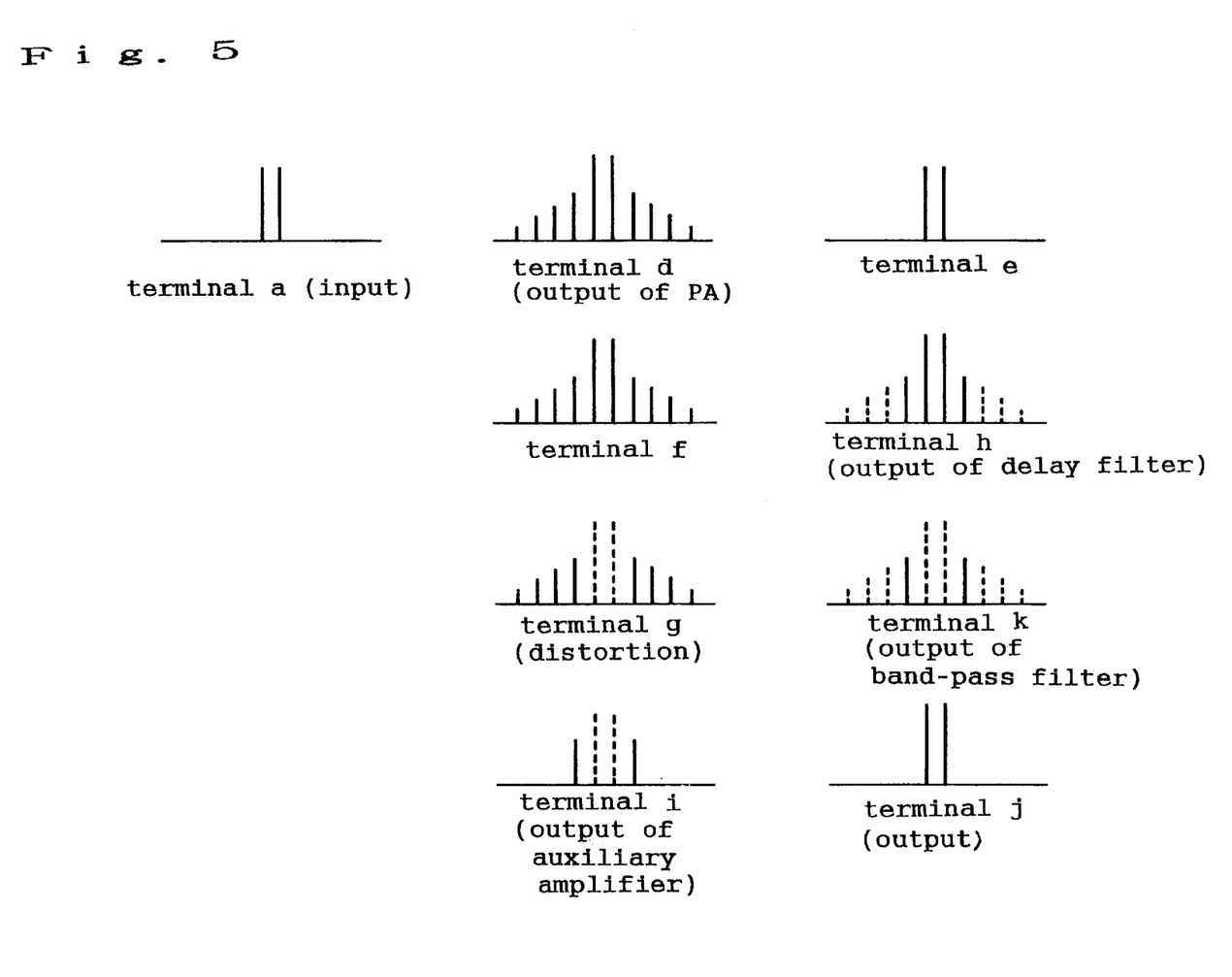
FIG. 5 is a frequency spectrum chart of signals at various portions of circuits of the embodiment of FIG. 4.

In the thus configured embodiment, as shown in FIG. 5, the signal input to the port h is a signal in which distortion components of the outer side band that has been discussed in the Related Art section are canceled. The output k from the band-pass filter 52 is a signal which contains distortion components but in which distortion components of the outer side are canceled.

Therefore, the signal which is combined by the power combiner 38 is a signal in which distortion components are canceled.

Figure 6:
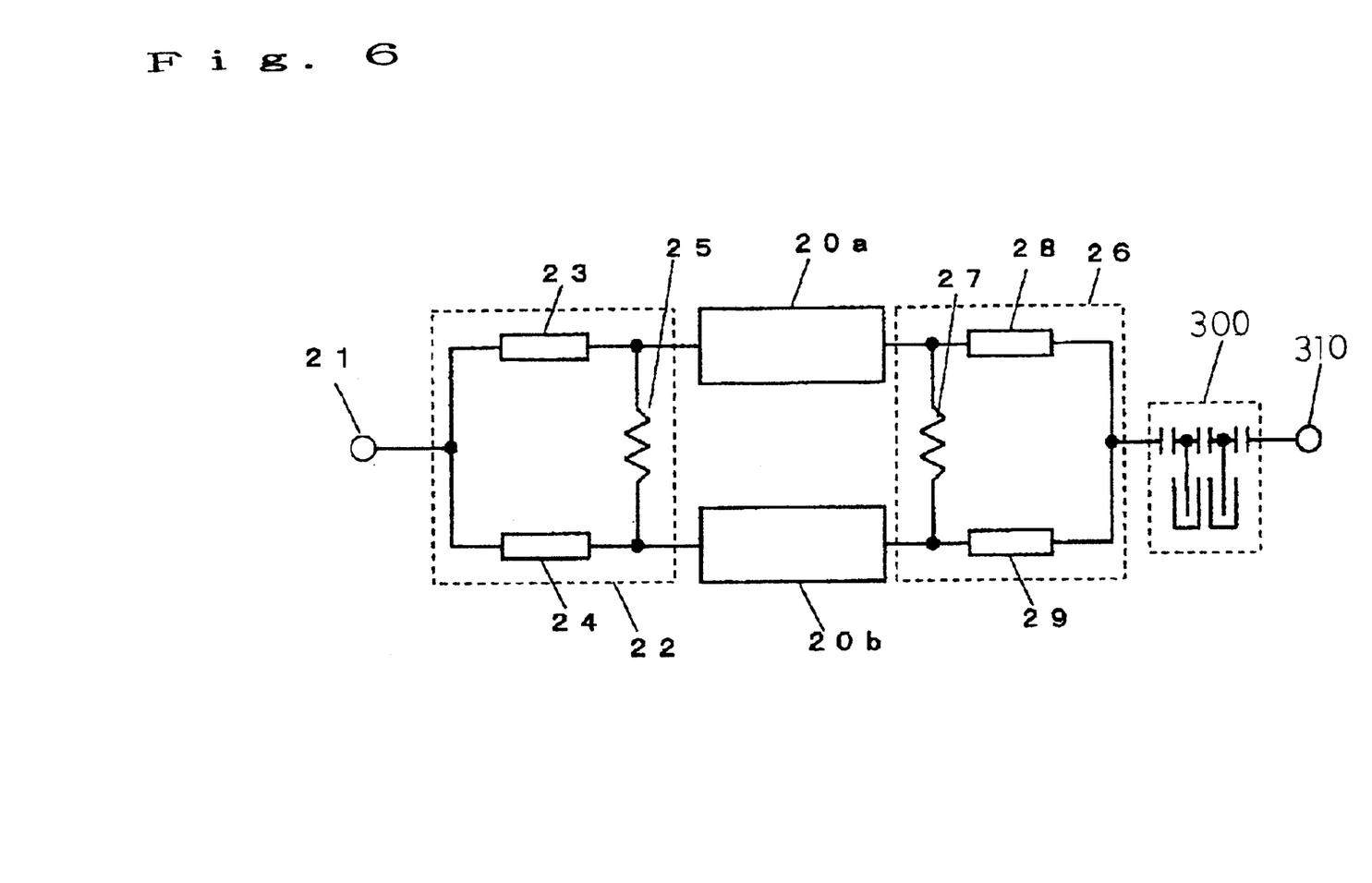
FIG. 6 is a block diagram of a feedforward amplifier which is an embodiment of another aspect of the invention.

Hereinafter, the further embodiment will be described with reference to FIG. 6 which is a block diagram of the feedforward amplifier. In the embodiment, in order to provide redundancy, two feedforward units are used so that, even when one of the units becomes faulty, the amplifier can continue to operate by using the other unit.

An input terminal 21 is connected to a Wilkinson power divider 22. The Wilkinson power divider 22 has: quarter-wavelength lines 23 and 24 corresponding to a quarter of the wavelength of a signal of the frequency which is to be amplified; and an absorbing resistor 25. The each ends of lines 23 and 24 are connected to the input terminal 21, and the other ends of the lines are connected to the ends of the absorbing resistor 25, respectively.

The ends of the absorbing resistor 25 are connected to input ends of mutually-independent feedforward units 20a and 20b. Each of the feedforward units 20a and 20b is identical with the feedforward unit 420 of FIG. 3.

Output terminals of the feedforward units are connected to a Wilkinson power combiner 26. The Wilkinson power combiner 26 has an absorbing resistor 27, and quarter-wavelength lines 28 and 29 which are connected to the ends of the resistor, respectively. The other ends of the quarter-wavelength lines 28 and 29 are connected to one end of a band-pass filter 300, and the other end of the band-pass filter 300 is connected to an output terminal 310. The band-pass filter 411 of FIG. 3 may be added to the configuration in which the band-pass filter 300 exists. It is a matter of course that each of the feedforward units 20a and 20b may be identical with the feedforward unit of FIG. 4.

In the embodiment, the two feedforward units are used. Alternatively, in order to increase the output power, further quarter-wavelength lines and absorbing resistors may be added to the Wilkinson power divider and combiner, and three or more feedforward units may be combinedly used.

A Wilkinson power divider and a Wilkinson power combiner are described in detail by, for example, KONISHI Yoshihiro "KOSHUHA.MICROWAVE KAIRO NO KOSEIHO," Jun. 20, 1993, p.p. 134 to 135, SOGO DENSHI SHUPPANSHA.

The operation of the embodiment will be described with reference to FIG. 6.

The Wilkinson power divider 22 divides the input from the input terminal 21 into two signals, and the signals are respectively amplified by the feedforward units 20a and 20b to be reduced with distortion. Thereafter, the powers of the signals are combined with each other by the Wilkinson power combiner 26, and distortion components outside the signal band are canceled by the band-pass filter 300. The resulting signal is supplied to the output terminal 310.

For example, a case where one of the feedforward units 20a and 20b, e.g., the unit 20b becomes faulty will be considered. In the input side, an influence due to the input terminal of the faulty feedforward unit 20b can be made substantially negligible by the absorbing resistor 25. As seen from the output terminal of the feedforward unit 20a, an influence due to the output terminal of the faulty feed for ward unit 20b can be made substantially negligible by the absorbing resistor 27. Although the output is reduced, therefore, the total system can continue to operate.

In the embodiment, an input signal is divided into plural signals by the Wilkinson power divider, the signals are amplified by using plural feedforward units according to the above-described embodiment, outputs of the units are combined with one another by the Wilkinson power combiner, and produced distortion is canceled by the band-pass filter, whereby a feedforward amplifier can be provided which can produce a high output power while consuming a small power, which, even when any one of the feedforward units is faulty, can continue to operate, and which is small in size and operates with a high efficiency.

As described above, the volume of the feedforward amplifier according to the third to seventh aspects of the invention can be remarkably reduced.

According to the invention, it is possible to attain an effect that distortion which has not been canceled by a feedforward circuit can be canceled.

Since redundancy is provided, the feedforward amplifier can continue to operate while only the output power is reduced, even when any one of the feedforward units becomes faulty during operation. Therefore, the reliability of a system can be enhanced.

What is claimed is:

1. A feedforward amplifier comprising:
   a power divider which divides an input signal into first and second divided signals;
   a first vector adjuster which adjusts amplitude and phase of the first divided signal;
   a main amplifier for amplifying an adjusted output of said first vector adjuster to provide an amplified signal;
   a first delay circuit which delays the second divided signal, said first delay circuit including a first distortion suppressing band-pass filter;
   a directional coupler which receives the amplified signal and has a main output port and a coupler output port;
   a first power combiner which combines a signal from said coupler output port and a first delayed signal from said first delay circuit;
   a second delay circuit which delays a signal from said main output port, said second delay circuit including a second distortion suppressing band-pass filter;
   a second vector adjuster which adjusts amplitude and phase of an output signal of said first power combiner;
   an error amplifier which amplifies an output signal of said second vector adjuster; and
   a second power combiner which combines an output signal of said second delay circuit with an output signal of said error amplifier, to provide a combined signal;
   said first vector adjuster and said first delay circuit adjusted to cancel objective signal components leaving only distortion components;
   said second vector adjuster and said second delay circuit adjusted to cancel distortion components leaving only objective signal components; and
   said first and second filters reducing distortion components of the input signal.

2. A feedforward amplifier according to claim 1, wherein said main amplifier is a class AB power amplifier.

3. A feedforward amplifier according to claim 1, wherein a band-pass filter which allows only a signal of an objective frequency to pass through said filter is disposed at an output end of said power combiner.

4. A feedforward amplifier according to claim 2, wherein a band-pass filter which allows only a signal of an objective frequency to pass through said filter is disposed at an output end of said power combiner.

5. A feedforward amplifier according to claim 1, wherein said second delay circuit functions also as a band-pass filter, a band-pass filter is disposed between said power combiner and said second vector adjuster, and distortion components which cannot be canceled by a feedforward function are canceled by a function of said band-pass filters.

6. A feedforward amplifier according to claim 2, wherein said second delay circuit functions also as a band-pass filter, a band-pass filter is disposed between said power combiner and said second vector adjuster, and distortion components which cannot be canceled by a feedforward function are canceled by a function of said band-pass filters.

7. A feedforward amplifier according to claim 1, in which said feedforward amplifier is one of a plurality of feedforward amplifiers, said feedforward amplifiers comprising:
   a divider which divides an input signal into outputs of plural systems;
   said plurality of feedforward amplifiers receiving the plural of divided outputs of said divider, respectively, and amplifying the output;
   a combiner which combines outputs of said plural feedforward amplifiers with one another; and
   a band-pass filter which is connected to an output end of said combiner, and which allows only a signal of an objective frequency to pass said filter.

8. A feedforward amplifier comprising:
   a first power divider which divides an input signal into first and second divided signals;
   a first vector adjuster which adjusts amplitude and phase of the first divided signal;
   a main amplifier which amplifies an adjusted output signal of said first vector adjuster to provide an amplified signal;
   a first delay circuit which delays the second divided signal;
   a directional coupler which receives the amplified signal and has a main output port and a coupler output port;
   a first power combiner which combines a signal from said coupler output port and a first delayed signal from said first delay circuit;
   second delay circuit which delays a signal from said main output port;

an auxiliary amplifier block which amplifies a signal from said first power combiner;

a second power combiner which combines a signal from said second delay circuit and an output signal from said auxiliary amplifier block, said auxiliary amplifier block including a broadband auxiliary amplifier block having at least two error amplifiers for splitting and amplifying an output signal from said first power combiner into respective frequency bands that are not overlapping each other; and said feedforward amplifier is one of a plurality of feedforward amplifiers, said plurality of feedforward amplifiers comprising:

a divider which divides an input signal into outputs of plural systems;

said plurality of feedforward amplifiers receiving the plural divided outputs of said divider, respectively, and amplifying the output;

a combiner which combines outputs of said plural feedforward amplifiers with one another; and a band-pass filter which is connected to an output end of said combiner, and which allows only a signal of an objective frequency to pass said filter.

9. A feedforward amplifier according to claim 3, in which said feedforward amplifier is one of a plurality of feedforward amplifiers, said feedforward amplifiers comprising:

a divider which divides an input signal into outputs of plural systems;

said plurality of feedforward amplifiers receiving the plural divided outputs of said divider, respectively, and amplifying the output;

a combiner which combines outputs of said plural feedforward amplifiers with one another; and a band-pass filter which is connected to an output and of said combiner, and which allows only a signal of an objective frequency to pass said filter.

10. A feedforward amplifier according to claim 4, in which said feedforward amplifier is one of a plurality of feedforward amplifiers, said feedforward amplifiers comprising:

a divider which divides an input signal into outputs of plural system;

said plurality of feedforward amplifiers receiving the plural divided outputs of said divider, respectively, and amplifying the output;

a combiner which combines outputs of said plural feedforward amplifiers with one another; and a band-pass filter which is connected to an output end of said combiner, and which allows only a signal of an objective frequency to pass said filter.

11. A feedforward amplifier according to claim 5, in which said feedforward amplifier is one of a plurality of feedforward amplifiers, said feedforward amplifiers comprising:

a divider which divides an input signal into outputs of plural systems;

said plurality of feedforward amplifiers receiving the plural divided outputs of said divider, respectively, and amplifying the output;

a combiner which combines outputs of said plural feedforward amplifiers with one another; and a band-pass filter which is connected to an output end of said combiner, and which allows only a signal of an objective frequency to pass said filter.

12. A feedforward amplifier according to claim 6, in which said feedforward amplifier is one of a plurality of feedforward amplifiers, said feedforward amplifiers comprising:

a divider which divides an input signal into outputs of plural systems;

said plurality of amplifiers receiving the plural divided outputs of said divider, respectively, and amplifying the output;

a combiner which combines outputs of said plural feedforward amplifiers with one another; and band-pass filter which is connected to an output end of said combiner, and which allows only a signal of an objective frequency to pass said filter.

\* \* \* \* \*

UNITED STATES PATENT AND TRADEMARK OFFICE
CERTIFICATE OF CORRECTION

PATENT NO.    : 6,326,845 B1
DATED         : December 4, 2001
INVENTOR(S)   : Masayuki Miyaji et al.

It is certified that error appears in the above-identified patent and that said Letters Patent is hereby corrected as shown below:

<u>Title page,</u>
Item [75], delete "Shinjonawate" and insert -- Shijonawate --; and
Item [56], References Cited, OTHER PUBLICATIONS, the John L. B. Walker publication has been listed twice. Please delete one of them.

Signed and Sealed this

Fifth Day of November, 2002

Attest:

JAMES E. ROGAN
*Director of the United States Patent and Trademark Office*

*Attesting Officer*